United States Patent
Kern et al.

(10) Patent No.: US 9,755,476 B2
(45) Date of Patent: Sep. 5, 2017

(54) OPERATOR CONTROL DEVICE HAVING AN ACTIVATION ELEMENT WITH HAPTIC FEEDBACK

(75) Inventors: Thorsten Alexander Kern, Alsbach (DE); Ingo Zoller, Hoesbach (DE)

(73) Assignee: Continental Automotive GmbH, Hannonver (DE)

( * ) Notice: Subject to any disclaimer, the term of this patent is extended or adjusted under 35 U.S.C. 154(b) by 694 days.

(21) Appl. No.: 14/342,723

(22) PCT Filed: Sep. 3, 2012

(86) PCT No.: PCT/EP2012/067050
§ 371 (c)(1),
(2), (4) Date: Mar. 4, 2014

(87) PCT Pub. No.: WO2013/034507
PCT Pub. Date: Mar. 14, 2013

(65) Prior Publication Data
US 2014/0210283 A1    Jul. 31, 2014

(30) Foreign Application Priority Data
Sep. 5, 2011  (DE) .......... 10 2011 082 142

(51) Int. Cl.
*H02K 33/00*    (2006.01)
*H02K 41/02*    (2006.01)
(Continued)

(52) U.S. Cl.
CPC .......... *H02K 7/003* (2013.01); *H03K 17/965* (2013.01); *H03K 2217/96062* (2013.01)

(58) Field of Classification Search
CPC ............. H02K 1/22; H02K 41/03; G09G 5/08
(Continued)

(56) References Cited

U.S. PATENT DOCUMENTS 4,879,556 A * 11/1989 Duimel ............... G01D 5/2073
                                                                200/6 A
5,189,390 A    2/1993 Fagard
(Continued)

FOREIGN PATENT DOCUMENTS

DE          69911805      8/2004
DE       10 2006 002634   2/2007
(Continued)

*Primary Examiner* — Jose Gonzalez Quinones
(74) *Attorney, Agent, or Firm* — Cozen O'Connor

(57) ABSTRACT

An operator control device includes: an activation element configured to provide haptic feedback to an operator, the activation element having a touch-sensitive operator control surface, and the activation element being configured to be activatable by an input member of the operator, triggering an activation signal; a pivoting axis to which the activation element is mounted so as to be pivotable about the axis between a position of rest and a switching position; a rotationally mounted magnetically influenceable element; and an electromagnetic actuator configured to be actuatable by the activation signal so as to generate a magnetic field that moves the rotationally mounted magnetically influenceable element from an initial position into a pivoting position. The movement of the magnetically influenceable element results in a torque sufficient to move the activation element out of the position of rest into the switching position being applied directly or indirectly to the activation element.

18 Claims, 2 Drawing Sheets

(51) Int. Cl.
    *G05G 1/08*         (2006.01)
    *G09G 5/08*         (2006.01)
    *H02K 7/00*         (2006.01)
    *H03K 17/965*     (2006.01)

(58) Field of Classification Search
    USPC ..... 310/12.27, 29, 49.22, 268; 345/156, 163
    See application file for complete search history.

(56) References Cited

U.S. PATENT DOCUMENTS

| | | |
|---|---|---|
| 6,339,419 B1 | 1/2002 | Jolly et al. |
| 6,704,001 B1 * | 3/2004 | Schena ................. G05G 9/047 |
| | | 310/12.04 |
| 6,982,696 B1 | 1/2006 | Shahoian et al. |
| 7,944,335 B2 | 5/2011 | Klossek et al. |
| 2002/0033795 A1 | 3/2002 | Shahoian et al. |
| 2003/0080939 A1 * | 5/2003 | Kobayashi ............. G05G 9/047 |
| | | 345/156 |
| 2010/0238053 A1 | 9/2010 | Schmidt et al. |
| 2012/0306798 A1 | 12/2012 | Zoller et al. |

FOREIGN PATENT DOCUMENTS

| | | | | |
|---|---|---|---|---|
| DE | 10 2008 060256 | | 6/2010 | |
| DE | 102008060256 | * | 6/2010 | ............. G05G 1/025 |
| DE | 10 20100007486 | | 8/2011 | |
| EP | 2 244 167 A2 | | 10/2010 | |
| EP | 2 244 168 A2 | | 10/2010 | |

\* cited by examiner

OPERATOR CONTROL DEVICE HAVING AN ACTIVATION ELEMENT WITH HAPTIC FEEDBACK

CROSS-REFERENCE TO RELATED APPLICATIONS

This is a U.S. national stage of application No. PCT/EP2012/067050, filed on 3 Sep. 2012, which claims priority to the German Application No. 10 2011 082 142.2, filed 5 Sep. 2011, the content of both incorporated herein by reference.

BACKGROUND OF THE INVENTION

1. Field of the Invention

The invention relates to an operator control device for an electrical apparatus, having an activation element with haptic feedback, which activation element has a touch-sensitive operator control surface, wherein the activation element can be activated by an operator by an input member and an activation signal can be triggered, and wherein the activation element is mounted so as to be pivotable about a pivoting axis between a position of rest and a switching position.

2. Related Art

Haptic feedback of operator control elements is required, in particular, when an operator cannot directly perceive the operator control process that he is carrying out. In the case of operator control apparatuses with electromechanical switches the operator can perceive the opening or closing of the switching contacts through changing haptics of the operator control element. However, this is not necessarily the case with electronic switches. For this reason, in the prior art, operator control elements are known that use movements of the operator control element that can be perceived by the operator to provide haptic feedback about an operator control process that has taken place. The known haptic operator control elements, for example for what are referred to as touchscreens, require a large installation space, a complex drive and, in particular, structural measures if the haptic operator control elements are to be used, for example, in an environment subject to particularly large temperature differences such as is the case, for example, in a motor vehicle, which must maintain its functional capability in extreme cold as well as in the heat of the summer.

SUMMARY OF THE INVENTION

An object of the invention is to specify an operator control device of the type mentioned at the beginning which has a simple, installation-space-saving design and generates haptic feedback that can be sensed unambiguously.

This object is achieved according to an aspect of the invention in that an electromagnetic actuator can be actuated by the activation signal so as to generate a magnetic field that moves a rotationally mounted, magnetically influenceable element from an initial position into a pivoting position. As a result of movement of the magnetically influenceable element a torque, which can move the activation element out of the position of rest into the switching position, can be applied directly or indirectly to the activation element.

By virtue of this aspect, in the case of a pivotably mounted activation element, the operator receives, after detection of activation by the input member, preferably a finger of the operator, haptic feedback in that the activation by the operator is assisted in its torque profile or actuation is carried out in opposition thereto.

In one aspect, bidirectional feedback is brought about if the activation signal can actuate a second electromagnetic actuator so as to generate a second magnetic field that can move the rotationally mounted, magnetically influenceable element out of the initial position into a second pivoting position. As a result of the movement of the magnetically influenceable element a torque, which can move the activation element out of the position of rest into a second switching position, can be applied directly or indirectly to the activation element.

In one aspect, the torque, which can act on the activation element by the first and/or second magnetically influenceable element, can be in the same or the opposite direction to the torque, which can act on the activation element by the input member.

According to one aspect of the present invention, a simple compact and cost-effective design is brought about if the electromagnetic actuator has a first pole shoe plate opposite which, approximately in parallel and at a distance, there is a second pole shoe plate that forms the magnetically influenceable element, wherein a coil which generates a magnetic field directed perpendicularly with respect to the plane of the first pole shoe plate, and which is assigned to the first pole shoe plate, is arranged between the first and second pole shoe plates.

In this context, in order to improve the magnetic flux from the first pole shoe plate to the second pole shoe plate, in one aspect, one free end of the first pole shoe plate can have a flux-directing element, which leads to close to a free end of the second pole shoe plate.

In another aspect, for bidirectional feedback, the second electromagnetic actuator can have a third pole shoe plate opposite which, approximately in parallel and at a distance, there is the second pole shoe plate that forms the magnetically influenceable element. A second coil, which generates a magnetic field directed perpendicularly with respect to the plane of the third pole shoe plate, and which is assigned to the third pole shoe plate, is arranged between the third and second pole shoe plates. The second pole shoe plate is arranged between the first pole shoe plate and the third pole shoe plate, wherein the first pole shoe plate and the third pole shoe plate can be connected by a flux conducting element in order to improve the magnetic flux.

If the first pole shoe plate has a first coil former directed toward the second pole shoe plate, and to which the first coil is assigned, and/or the third pole shoe plate has a second coil former directed toward the second pole shoe plate and to which the second coil is assigned, the magnetic flux generated by the coils is directed and the application of force between the pole shoe plates is increased further.

In this context, the first coil can surround the first coil former, and/or the second coil can surround the second coil former.

According to another aspect of the present invention, a particularly flat and therefore installation-space-saving design is brought about if the first coil and/or the second coil are flat coils composed of conductor tracks applied to a printed circuit board.

An easily sensed feedback can be brought about according to one aspect if the activation element is a two-armed lever mounted so as to be pivotable about the pivoting axis and on whose one lever arm the operator control surface, on which the input member can act, is arranged.

In this context, a compact design with few components can be obtained according to another aspect if the magnetically influenceable element is permanently connected to the second lever arm of the activation element.

A compact installation depth with at the same time a very flat design is obtained in accordance with an aspect of the present invention in that the second pole shoe plate is mounted so as to be pivotable about a second pivoting axis parallel to the first pivoting axis, and the second pole shoe plate is coupled in articulated fashion at an articulation point of the activation element at a distance from the second pivoting axis, the articulation point being arranged at a distance from the first pivoting axis.

In this context, in another aspect, for bidirectional feedback two electromagnetic actuators are assigned to the first pole shoe plate, wherein an actuator is arranged on each side of the second pivoting axis.

In this context, in another aspect, the coils of the two actuators are arranged on a common printed circuit board.

After actuation of the electromagnetic actuator, the magnetically influenceable element is easily returned to its initial position if the rotatably mounted magnetically influenceable element can be moved out of its initial position into its pivoting position counter to a spring force.

However, it is also possible, in another aspect, for the rotatably mounted, magnetically influenceable element to be secured in a frictionally locking fashion in its first and/or second pivoting position and to be reset into the initial position only by manual activation of the activation element or by actuation of an actuator which can be actuated in the direction of the initial position.

BRIEF DESCRIPTION OF THE DRAWINGS

Exemplary embodiments of the invention are illustrated in the drawing and will be described in more detail below. In the drawings.

DETAILED DESCRIPTION OF THE PRESENTLY PREFERRED EMBODIMENTS

The illustrated operator control devices have a two-armed lever 1 mounted so as to be pivotable about a first pivoting axis 2.

A first lever arm of the lever 1 has an operator control surface 3, which can be acted on by an input member, in particular a finger of a hand of an operator.

Figure 1:
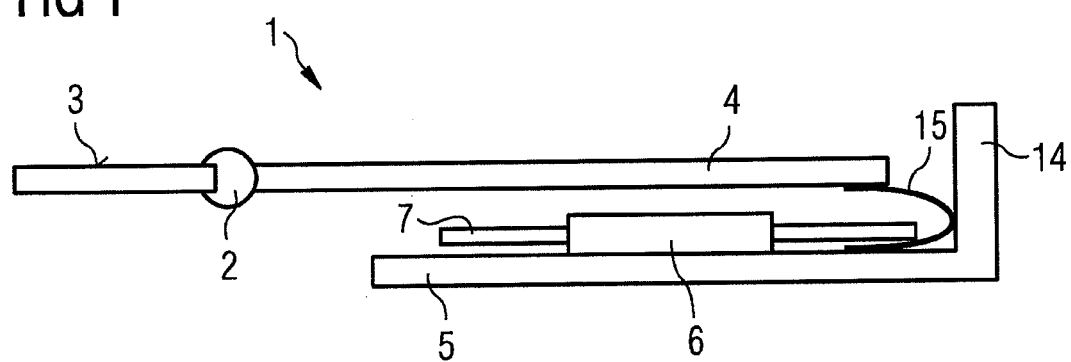
FIG. 1 is a side view of a first exemplary embodiment of an operator control device.
Figure 2:
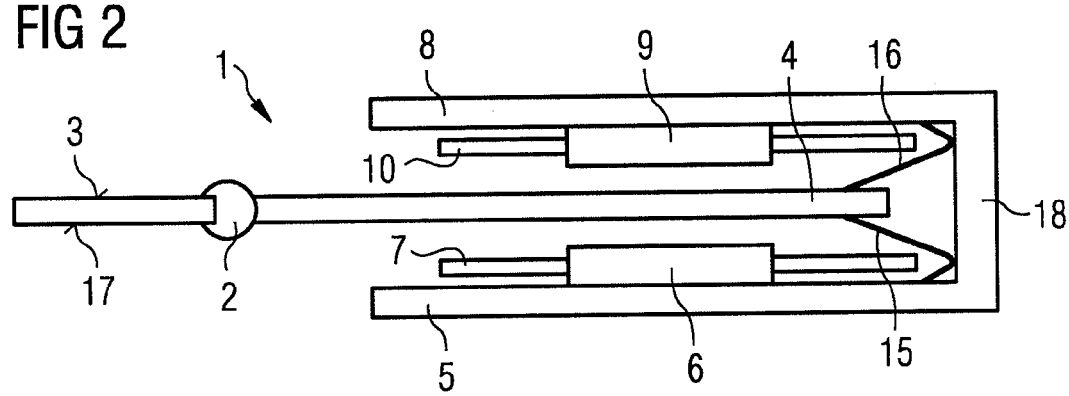
FIG. 2 is a side view of a second exemplary embodiment of an operator control device.
Figure 3:
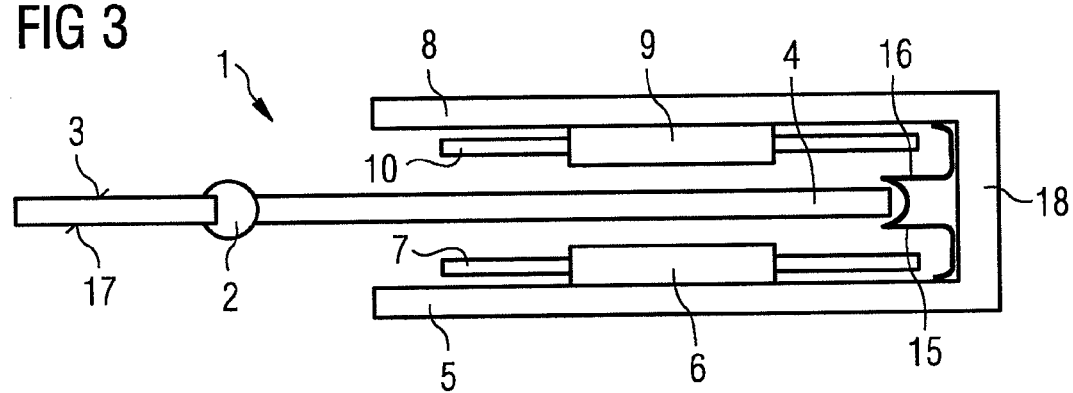
FIG. 3 is a side view of a third exemplary embodiment of an operator control device.

In FIGS. 1 to 3, a second lever arm of the lever 1 forms a second pole shoe plate 4, which is composed of a ferromagnetic material.

Opposite the second pole shoe plate 4 there is, approximately in parallel and at a distance, a first pole shoe plate 5, which is also composed of a ferromagnetic material and which has a first coil former 6, which is directed toward the second pole shoe plate 4.

Arranged between the first pole shoe plate 5 and second pole shoe plate 4 is, parallel thereto, a first printed circuit board 7, which has an opening through which the first coil former 6 projects.

Arranged on the first printed circuit board 7 is a first flat coil (not illustrated), which surrounds the first coil former 6 and is composed of conductor tracks applied to the first printed circuit board 7.

In the exemplary embodiments illustrated in FIGS. 2 and 3, arranged on the side of the second pole shoe plate 4 facing away from the first pole shoe plate 5, there is also, approximately parallel thereto and at a distance, a third pole shoe plate 8 composed of a ferromagnetic material and having a second coil former 9 directed toward the second pole shoe plate 4.

Arranged between the third pole shoe plate 8 and the second pole shoe plate 4 is, parallel thereto, a second printed circuit board 10, which has an opening through which the second coil former 9 projects.

A second flat coil is arranged on the second printed circuit board 10 in the same way as on the first printed circuit board 7.

Figure 4:
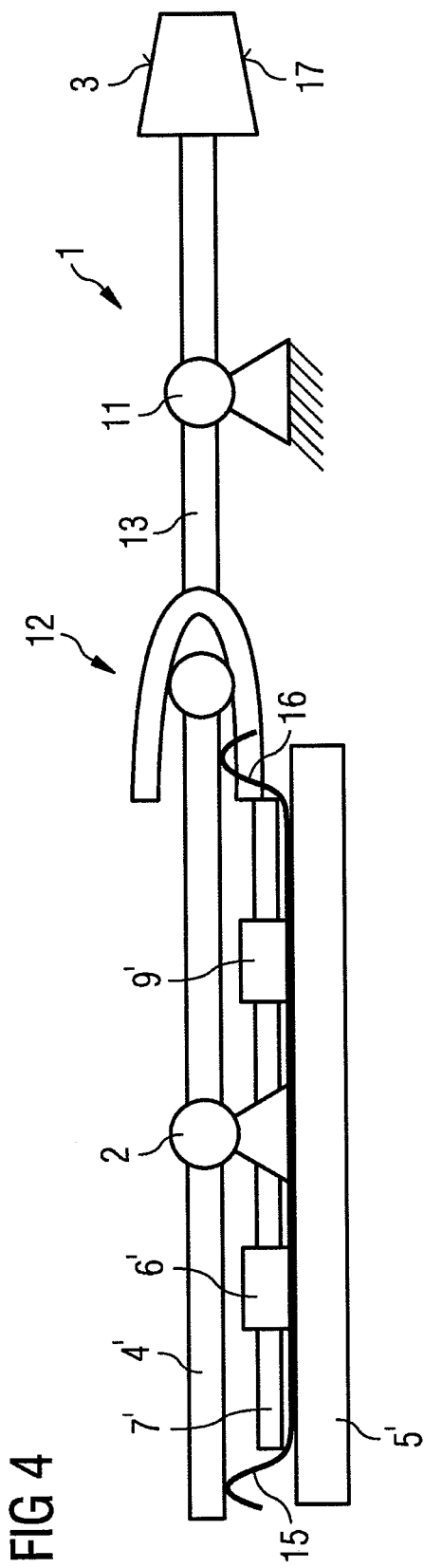
FIG. 4 is a side view of a fourth exemplary embodiment of an operator control device.

In FIG. 4, a second pole shoe plate 4', composed of a ferromagnetic material, is mounted approximately centrally so as to be pivotable about a first pivoting axis 2 and is connected in an articulated fashion at one of its ends to the lever 1 extending approximately in the same plane, by an articulation point with a second lever arm 13 of the lever 1 mounted so as to be pivotable about a second pivoting axis 11 which is parallel to the first pivoting axis 2.

Arranged at a distance and approximately parallel to the second pole shoe plate 4' is a first pole shoe plate 5' composed of a ferromagnetic material and having a first coil former 6' on the one side at a distance from the second pivoting axis 11, and a second coil former 9 on the other side at a distance from the second pivoting axis 11.

Arranged between the first pole shoe plate 5' and the second pole shoe plate 4' is, approximately parallel thereto, a first printed circuit board 7', which has openings through which the first and second coil formers 6', 9' project.

A first flat coil, which surrounds the first coil former 6', and a second flat coil, which surrounds the second coil former 9', are arranged on the first printed circuit board 7', in accordance with FIGS. 1 to 3.

In the exemplary embodiment illustrated in FIG. 1, the first pole shoe plate 5 has, at one of its ends, a flux-conducting element 14 which leads to close to the one end of the second pole shoe plate 4, while in the exemplary embodiments illustrated in FIGS. 2 and 3 the one ends of the first and third pole shoe plates 5 and 8 are connected to one another by a flux conducting element 18.

In all the exemplary embodiments, the second pole shoe plates 4, 4' can be moved out of their illustrated initial position into their pivoting position counter to a spring force when the touch-sensitive operator control surface 3 is activated and an activation signal is triggered, by which activation signal the respective flat coil is energized and a magnetic field is generated.

In this context, in the exemplary embodiment in FIG. 1, the magnetic field pulls the second pole shoe plate 4 to be close to the first coil former 6 counter to the force of a first spring element 15, with the result that the lever 1 pivots about the first pivoting axis 2 in its pivoting position, which counteracts the action on the operator control surface 3 and is sensed haptically by the operator.

In the exemplary embodiments in FIGS. 2 to 4, the same function occurs when the operator control surface 3 is acted on.

When the second operator control surface 17, which is arranged opposite the operator control surface 3, is acted on, the flux coil assigned to the second coil former 9, 9' is energized and the second pole shoe plate 4, 4' is attracted to be close to the second coil former 9, 9' counter to the force of a second spring element 16, with the result that the lever 1 is pivoted about the first pivoting axis 2 into a second pivoting position in the opposite direction, which counteracts the action on the second operator control surface 17 and is sensed haptically by the operator.

In this context, in the exemplary embodiment in FIG. 3 the second pole shoe plate 4 is secured in its first or second pivoting position by the first or second spring element 15 and until resetting of the magnetic field is brought about either by acting on the lever 1 manually or by briefly actuating the opposing flat coil.

In FIG. 4, the pivoting movement of the second pole shoe plate 4' is transmitted to the lever 1 via the articulation point 12.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An operator control device for an electrical apparatus, comprising:
 an activation element configured to provide haptic feedback to an operator, the activation element having a touch-sensitive operator control surface, and the activation element being configured to be activatable by an input member of the operator, triggering an activation signal, the activation element having an articulation point;
 a first pivoting axis to which the activation element is mounted so as to be pivotable about the axis between a position of rest and a switching position, the articulation point being arranged at a distance from the first pivoting axis;
 a second pivoting axis, parallel to the first pivoting axis;
 a rotationally mounted magnetically influenceable element; and
 an electromagnetic actuator configured to be actuatable by the activation signal so as to generate a magnetic field that moves the rotationally mounted magnetically influenceable element from an initial position into a pivoting position,
 wherein, as a result of movement of the magnetically influenceable element, a torque sufficient to move the activation element out of the position of rest into the switching position is applied directly or indirectly to the activation element.

2. The operator control device as claimed in claim 1, further comprising a second electromagnetic actuator, actuatable by the activation signal so as to generate a second magnetic field that moves the rotationally mounted, magnetically influenceable element out of the initial position into a second pivoting position, wherein, as a result of the movement of the magnetically influenceable element, a torque sufficient to move the activation element out of the position of rest into a second switching position is applied directly or indirectly to the activation element.

3. The operator control device as claimed in claim 1, wherein the torque applied to the activation element by the magnetically influenceable element is in the same or the opposite direction to a torque that is applied to the activation element by the input member of the operator.

4. The operator control device as claimed in claim 2, wherein the electromagnetic actuator has:
 a first pole shoe plate;
 a second pole shoe plate, approximately parallel to, at a distance from, and oppositely disposed in relation to, the first pole shoe plate, the second pole shoe plate forming the magnetically influenceable element; and
 a coil, configured to generate a magnetic field directed perpendicularly with respect to the plane of the first pole shoe plate, and which is assigned to the first pole shoe plate, the coil being arranged between the first and second pole shoe plates.

5. The operator control device as claimed in claim 4, wherein the second electromagnetic actuator has:
 a third pole shoe plate, oppositely disposed in relation to, and approximately in parallel with and at a distance from, the second pole shoe plate which forms the magnetically influenceable element; and
 a second coil, configured to generate a magnetic field directed perpendicularly with respect to the plane of the third pole shoe plate, and which is assigned to the third pole shoe plate, the second coil being arranged between the third and second pole shoe plates,
 wherein the second pole shoe plate is arranged between the first pole shoe plate (5) and the third pole shoe plate.

6. The operator control device as claimed in claim 5, wherein the first pole shoe plate has a first coil former directed toward the second pole shoe plate and to which the first coil is assigned, and/or the third pole shoe plate has a second coil former directed toward the second pole shoe plate and to which the second coil is assigned.

7. The operator control device as claimed in claim 6, wherein the first coil surrounds the first coil former, and/or the second coil surrounds the second coil former.

8. The operator control device as claimed in claim 7, wherein the first coil and/or the second coil are flat coils composed of conductor tracks applied to a printed circuit board.

9. The operator control device as claimed in claim 1, wherein the activation element comprises a two-armed lever mounted so as to be pivotable about the first pivoting axis, the operator control surface on which the input member can act being arranged on a first arm of the two-armed lever.

10. The operator control device as claimed in claim 9, wherein the magnetically influenceable element is permanently connected to a second lever arm of the two-armed lever.

11. The operator control device as claimed in claim 1, wherein the rotatably mounted magnetically influenceable element is movable out of its initial position into its pivoting position counter to a spring force.

12. The operator control device as claimed in claim 1, wherein the rotatably mounted magnetically influenceable element is secured in a frictionally locking fashion in its first and/or second pivoting position.

13. An operator control device for an electrical apparatus, comprising:
 an activation element configured to provide haptic feedback to an operator, the activation element having a touch-sensitive operator control surface, and the activation element being configured to be activatable by an input member of the operator, triggering an activation signal;

a first pivoting axis to which the activation element is mounted so as to be pivotable about the axis between a position of rest and a switching position;

a second pivoting axis parallel to the first pivoting axis;

a rotationally mounted magnetically influenceable element;

a first electromagnetic actuator configured to be actuatable by the activation signal so as to generate a magnetic field that moves the rotationally mounted magnetically influenceable element from an initial position into a pivoting position, wherein, as a result of movement of the magnetically influenceable element, a torque sufficient to move the activation element out of the position of rest into the switching position is applied directly or indirectly to the activation element; and a second electromagnetic actuator, actuatable by the activation signal so as to generate a second magnetic field that moves the rotationally mounted, magnetically influenceable element out of the initial position into a second pivoting position, wherein, as a result of the movement of the magnetically influenceable element, a torque sufficient to move the activation element out of the position of rest into a second switching position is applied directly or indirectly to the activation element, wherein the first electromagnetic actuator has:

a first pole shoe plate;

a second pole shoe plate, approximately parallel to, at a distance from, and oppositely disposed in relation to, the first pole shoe plate, the second pole shoe plate forming the magnetically influenceable element; and a coil, configured to generate a magnetic field directed perpendicularly with respect to the plane of the first pole shoe plate, and which is assigned to the first pole shoe plate, the coil being arranged between the first and second pole shoe plates, wherein the second pole shoe plate is mounted so as to be pivotable about the second pivoting axis, and said second pole shoe plate is coupled in articulated fashion at an articulation point of the activation element at a distance from the second pivoting axis, said articulation point being arranged at a distance from the first pivoting axis.

14. The operator control device as claimed in claim 13, wherein two electromagnetic actuators are assigned to the first pole shoe plate, wherein the two electromagnetic actuators are arranged one on each side of the second pivoting axis.

15. The operator control device as claimed in claim 13, wherein the second electromagnetic actuator has:

a third pole shoe plate, oppositely disposed in relation to, and approximately in parallel with and at a distance from, the second pole shoe plate which forms the magnetically influenceable element; and a second coil, configured to generate a magnetic field directed perpendicularly with respect to the plane of the third pole shoe plate, and which is assigned to the third pole shoe plate, the second coil being arranged between the third and second pole shoe plates, wherein the second pole shoe plate is arranged between the first pole shoe plate and the third pole shoe plate.

16. The operator control device as claimed in claim 15, wherein the first pole shoe plate has a first coil former directed toward the second pole shoe plate and to which the first coil is assigned, and/or the third pole shoe plate has a second coil former directed toward the second pole shoe plate and to which the second coil is assigned.

17. The operator control device as claimed in claim 16, wherein the first coil surrounds the first coil former, and/or the second coil surrounds the second coil former.

18. The operator control device as claimed in claim 17, wherein the first coil and/or the second coil are flat coils composed of conductor tracks applied to a printed circuit board.

\* \* \* \* \*